United States Patent [19]

Young et al.

[11] 4,362,992

[45] Dec. 7, 1982

[54] SYSTEM AND METHOD OF DETECTING THE PROXIMITY OF AN ALTERNATING MAGNETIC FIELD

[75] Inventors: David G. Young, Bracknell; Peter D. Finch, Woking, both of England

[73] Assignee: Sperry Limited, Bracknell, England

[21] Appl. No.: 876,302

[22] Filed: Jan. 30, 1978

[51] Int. Cl.³ ............................................. G01R 33/02
[52] U.S. Cl. .................................... 324/247; 324/260; 340/657
[58] Field of Search .................... 324/8, 245, 246, 254, 324/256, 257, 260, 247; 340/547, 551, 567, 600, 657

[56] References Cited

U.S. PATENT DOCUMENTS

| | | | |
|---|---|---|---|
| 2,996,663 | 8/1961 | Ferguson | 324/245 |
| 3,488,579 | 1/1970 | Schonstedt | 324/245 |
| 3,582,932 | 6/1971 | Chapman | 340/551 |
| 3,624,598 | 11/1971 | Foster | 340/26 |
| 3,745,549 | 7/1973 | Jepperson et al. | 340/600 |
| 3,983,475 | 9/1976 | Watanabe et al. | 324/254 |

FOREIGN PATENT DOCUMENTS 748546 12/1966 Canada ................................ 324/247

Primary Examiner—S. C. Buczinski
Attorney, Agent, or Firm—Howard P. Terry

[57] ABSTRACT

A system for, and a method of, detecting the proximity of a source of an alternating magnetic field, such as that emanating from power transmission cables, comprising a sensor coil sensitive to the magnetic field under detection, processing means to derive from the signal induced in the coil a warning signal indicative of the proximity of the magnetic field under detection, and cancelling means operable to cancel the earth's field in the region of the sensor coil. The sensor coil may be one of a pair operable to provide a signal representative of the directional heading of the magnetic field under detection, with respect to the system, which embodiment is particularly useful in helicopters for detecting the proximity of power cables.

10 Claims, 5 Drawing Figures

SYSTEM AND METHOD OF DETECTING THE PROXIMITY OF AN ALTERNATING MAGNETIC FIELD

This invention relates to a system for and a method of detecting the proximity of a source of an alternating magnetic field particularly, though not exclusively, that emanating from power transmission cables.

Such cables present a hazard to low-flying aircraft, especially helicopters, and it has been proposed that the proximity of the cables be detected by sensor coils which are mounted in the aircraft and which sense the magnetic fields generated by alternating electric current passing along the cables, thereby enabling warnings of the proximity of the cables to be given to pilots.

Since the alternating current passing along power transmission lines oscillates at 50 Hz, as far as the United Kingdom is concerned, the resulting magnetic field also oscillates at 50 Hz. Signals induced in the coils at similar frequencies, other than those induced by the cable field, will therefore represent noise which will reduce the sensitivity and accuracy of the system. The effects of noise generated by local 50 Hz fields in the aircraft can be minimised by suitable choice of location of the sensor coils. Noise generated as a result of vibration of the sensor coils at or near 50 Hz in the earth's magnetic field is not so easily overcome however, and represents a particular problem because the earth's magnetic field is likely to be of the order of $10^5$ times stronger than the cable-generated field.

The measurement of vibration levels in aircraft and the design of anti-vibration mountings is a lengthy and expensive process. Moreover, complete vibration isolation of the sensor coils would not entirely solve the problem because this would mean that the aircraft would vibrate around the sensor coils so that current-carrying conductors in the aircraft would induce noise in the sensor coils. The invention aims to solve the foregoing problem of vibration-induced noise in the sensor coils.

According to one aspect of the invention a system for detecting the proximity of a source of an alternating magnetic field comprises a sensor coil sensitive to said source of magnetic field, processing means operative to derive from the signal induced in the coil a warning signal indicative of the proximity of said source, and cancelling means which cancel the earth's field in the region of the sensor coil.

The sensor coil may be one of a pair of such coils mounted in respective generally vertical non-parallel planes and sensitive to the horizontal component of the magnetic field under detection, such as that generated by a current flowing in a power cable, the processing means then being operative to derive the ratio of the signals induced in the two coils, this ratio being representative of the directional heading of the cable with respect to the system.

Alternatively, said sensor coil may be used to determine only the magnitude of the field generated by the current in the cable, a pair of further sensor coils being mounted in respective generally vertical non-parallel planes to detect the directional heading of the cable with respect to the system.

The pair of sensor coils are preferably mounted at right-angles to one another since this makes the relationship between the ratio of the signals and the directional heading of the cable a simple trigonometrical one.

The cancelling means may comprise compensating coils mounted on the sensor coils or on a housing of the system, and these compensating coils may be arranged in a Helmholtz configuration to provide a zero field in the region of the sensor coils. The cancelling means may comprise a three-axis magnetometer which causes three sets of compensating coils, associated with respective axes, to be energised through a current servo to null the field detected by the magnetometer. Alternatively the cancelling means may include a flux valve which may either be the flux valve of the navigational instruments of the aircraft in which the system is fitted or may be a separate flux valve.

As an alternative to the use of compensating coils, the cancelling means may be a source of d.c. current which, when fed to the sensor coils, cancels the earth's magnetic field so that the latter is 'backed-off'. The d.c. current fed to the sensor coils to back-off the earth's field may be derived from signals originating in the magnetometer or flux valve.

It is envisaged that it may be possible to use a Hall Effect generator to derive a signal that cancels the earth's magnetic field.

The horizontal and vertical components of the earth's magnetic field in the United Kingdom are of the order of 0.2 Gauss and 0.4 Gauss, respectively. For a coil of length 1 cm the ampere turns to effect cancellation of the earth's horizontal and vertical components are 0.16 and 0.32 respectively. Since each sensor coil is likely to have of the order of 8000 turns, it is preferred to use compensating coils rather than apply the cancelling signals to the sensor coils.

According to another aspect of the invention a method of detecting the proximity of a source of an alternating magnetic field comprises utilising a sensor coil sensitive to the source of magnetic field, deriving from the signal induced in the coil a warning signal indicative of the proximity of said source and cancelling the earth's magnetic field in the region of the sensor coil.

Two systems according to the invention will now be described, by way of example, with reference to the accompanying drawings, in which:-

Each system comprises a pair of sensor coils rigidly mounted on the airframe of a helicopter in respective orthogonal vertical planes. When the helicopter approaches power transmission cables carrying current at 50 Hz, respective signals at 50 Hz are induced in the coils by the horizontal component of the field set up by the current in the cables. These signals are fed to processing means 11 of the system which derive the quotient of the signals and produce an output indicative of the directional heading of the cable with respect to the helicopter. The system may also include a further coil which senses only the magnitude of the field and which enables the processing means to provide an early warning of the presence of cables.

The invention is concerned with the manner in which the earth's magnetic field is cancelled in the region of the sensor coils in order to prevent vibration of the helicopter inducing signals in the coils which are indistinguishable from the desired signals induced by the oscillating magnetic field of the cable.

Figure 1:
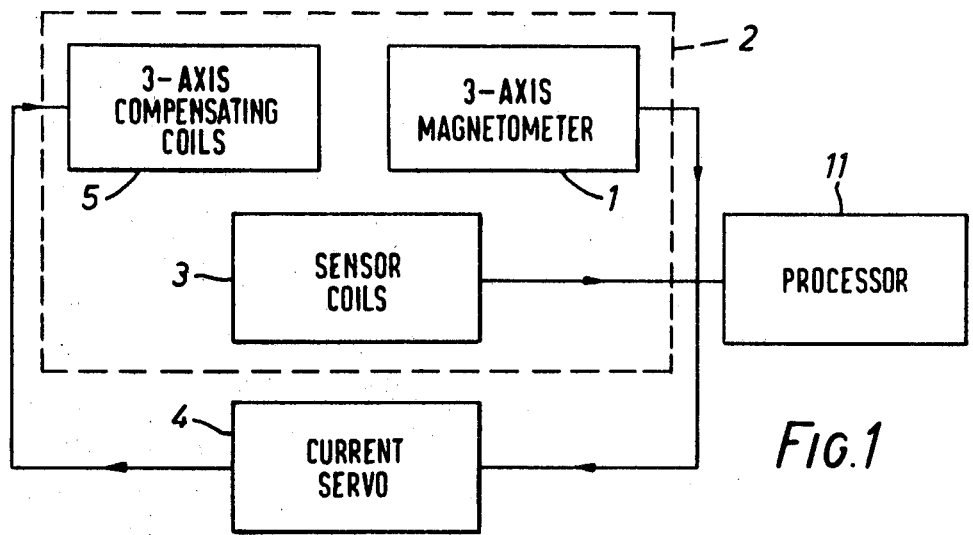
FIG. 1 is a schematic diagram showing the sensor coils and cancelling means of one system.
Figure 3:
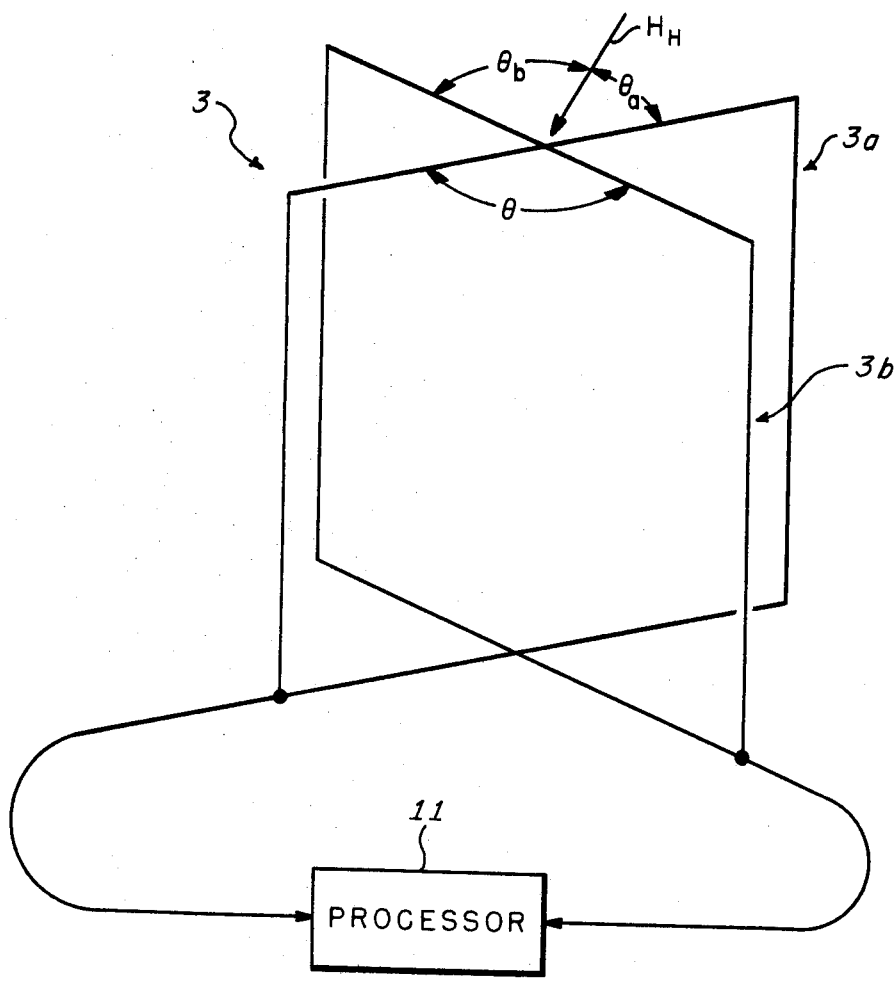
FIG. 3 is a schematic diagram showing the relative orientation of two vertical coils utilized for determining the heading of a horizontal magnetic field.

FIG. 1 shows how one of the systems according to the invention achieves this result. A three-axis magnetometer 1 is mounted in the housing 2 accommodating the sensor coils 3, and signals from the magnetometer are fed to current servos 4 which may be relatively positioned as are coils 3a and 3b in FIG. 3 in turn power compensating coils 5 associated with respective axes. Though a magnetometer is utilized for purposes of explanation it should be understood by those skilled in the art that any other static magnetic field sensing device, such as a Hall effect device, may also be employed. Any signals detected by the magnetometer 1 are thus nulled by a feedback effect. This arrangement is accurate because it is not affected by manoeuvres of the helicopter and because it eliminates the total field (i.e. the earth's field and any local uni-directional field) in the region of the sensor coils 3. Coils 3 are rigidly mounted substantially vertically with respect to the aircraft with an angle $\theta$ therebetween in the horizontal plane. The angle $\theta$ is generally 90° but it should be apparent to those skilled in the art that deviations from this value are permissible without adversely affecting the operation of the system. Each coil 3a and 3b is sensitive to the component of the horizontal magnetic field normal to the plane of the coil, thus inducing currents therein which respectively are functions of the angle $\theta_a$ and $\theta_b$ which the horizontal field forms with these planes. These induced currents are coupled to the processor 11 wherein the directional heading of the cable, which is a source of the horizontal magnetic field $H_H$, is determined.

Figure 4:
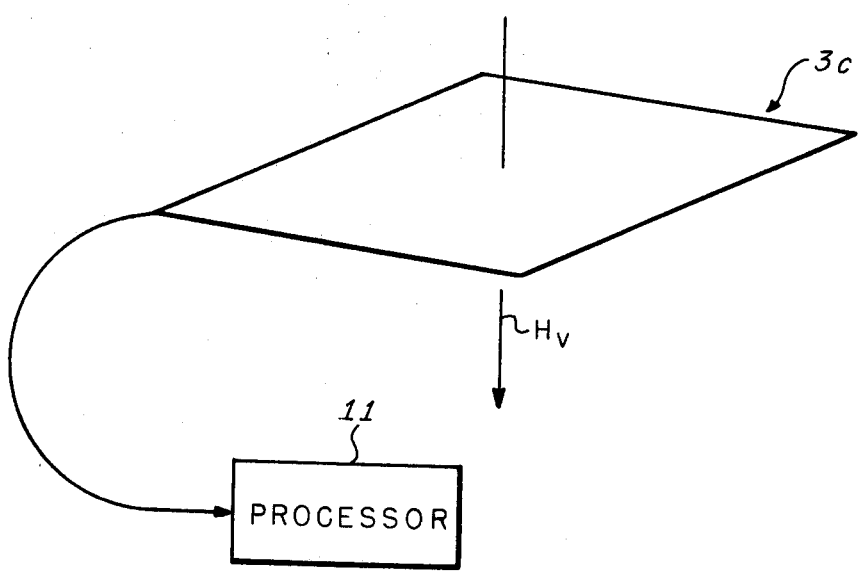
FIG. 4 is a schematic diagram of a horizontal coil utilized for detecting vertical magnetic fields.

In addition to the heading of the cable, the magnitude of the magnetic field generated by the current therein may be determined by mounting a third coil 3c, shown in FIG. 4, in the horizontal plane of the aircraft. Currents induced in coil 3c are sensitive to the vertical magnetic field $H_V$ and are representative of the magnitude of the magnetic field generated by the current in the cable.

Figure 5:
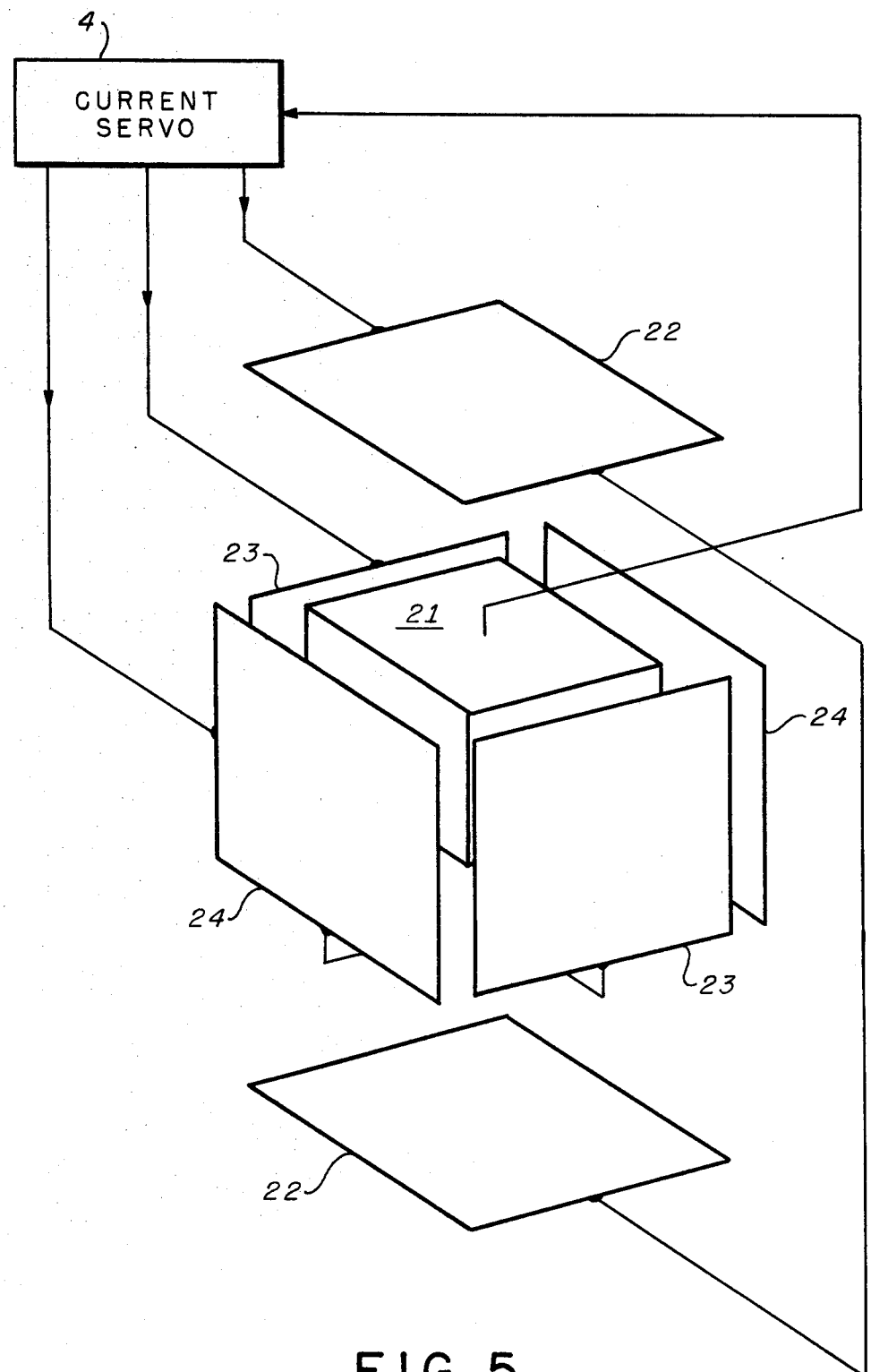
FIG. 5 is a schematic diagram showing the positioning of Helmholtz coils about an enclosure containing sensor and static magnetic field detector coils.

Referring now to FIG. 5, the three axes magnetometers and sensor coils 21 are positioned within three pairs of Hemholtz coils 22, 23 and 24. Each pair of coils 22, 23 and 24 are coupled so that currents in each coil of the pair are equal and flow in the same direction. Signals representative of the surrounding static magnetic field are coupled from the magnetometer in the enclosure 21 to the current servo 4. The current servo 4 utilizes these signals to generate dc currents that are coupled to the compensating coils 22, 23 and 24 which cause static magnetic fields of the proper amplitude and direction to cancel a static field surrounding the sensor coils.

Figure 2:
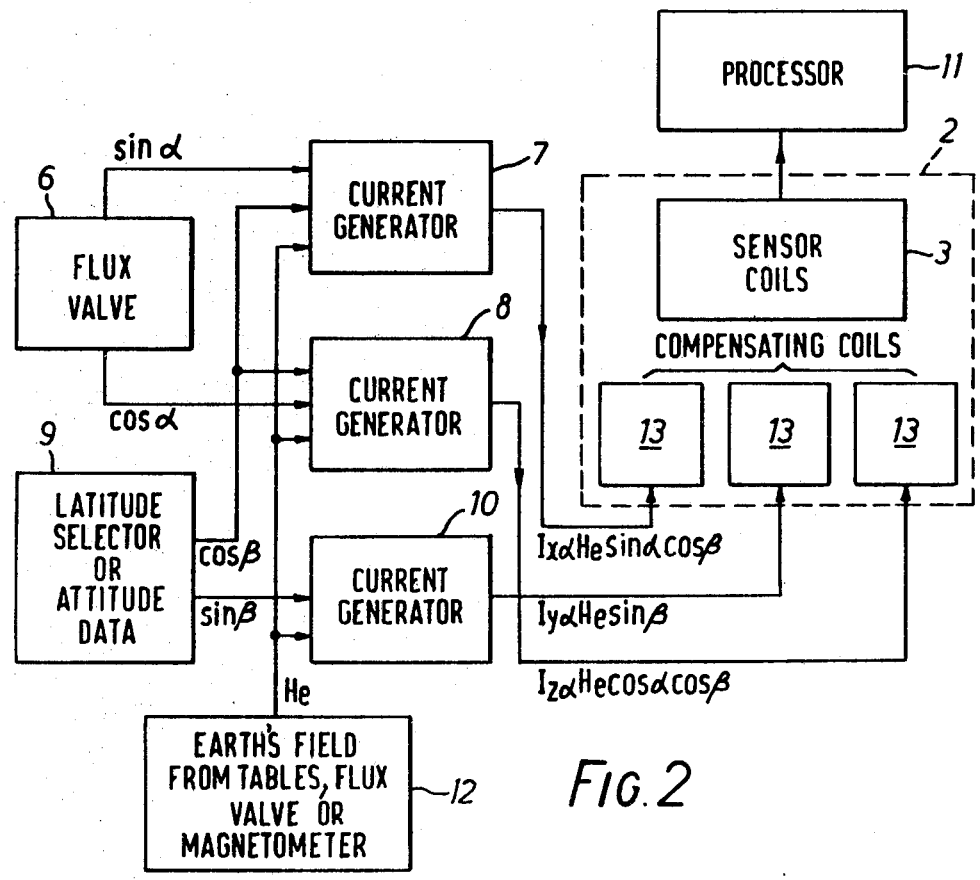
FIG. 2 is a schematic diagram of the sensor coils and cancelling means of the other system.

In the system of FIG. 2 cancellation of the earth's field is achieved by the use of a flux valve 6 which may either be the navigational flux valve of the helicopter or may be a separate flux valve. The flux valve 6 produces signals representative of $\sin \alpha$ and $\cos \alpha$ where $\alpha$ is the magnetic heading of the helicopter. These signals are fed to respective current generators 7 and 8. A unit 9 produces $\cos \beta$ and $\sin \beta$ signals which compensate for latitude or attitude of the helicopters. The $\cos \beta$ signal is fed to both of the current generators 7 and 8 and the $\sin \beta$ signal is fed to a further current generator 10. Variation in the earth's magnetic field from place to place is compensated by a unit 12 producing a signal $H_e$ which is fed to each of the three current generators 7, 8 and 10.

As shown in FIG. 2, the generator 7 produces a d.c. current $I_x$ which is proportional to $H_e \sin \alpha \cos \beta$, the generator 10 produces a d.c. current $I_y$ proportional to $H_e \sin \beta$ and the generator 8 produces a d.c. current $I_z$ proportional to $H_e \cos \alpha \cos \beta$. The three d.c. currents $I_x$, $I_y$ and $I_z$ are respectively fed to three compensating coils 13 mounted in the housing 2 containing the sensor coils 3.

The system of FIG. 2 will not compensate for any local d.c. field other than the earth's magnetic field and will not compensate for roll of the helicopter, although account can be taken of this by arranging for the unit 9 to provide further compensating signals representative of the roll of the helicopter.

It will be appreciated that the invention is applicable to the detection of any alternating magnetic field, irrespective of frequency. Thus, fields emanating from power cables can be detected irrespective of whether the frequency is 50 Hz as in the United Kingdom or 60 Hz in the United States of America, for example.

We claim:

1. A system for detecting the proximity of a source of an alternating magnetic field, said magnetic field having a horizontal component with a horizontal magnitude and a vertical component with a vertical magnitude comprising:

sensor means including first and second sensor coils, mounted in respective generally vertical non-parallel planes, each substantially responsive to said horizontal component of said alternating magnetic field for respectively producing first and second signals;

processing means coupled to receive said first and second signals for deriving a warning signal that is indicative of the proximity of said source and for determining the ratio of said second signal to said first signal, said ratio being representative of the directional heading of said source with respect to said system; and means for cancelling the earth's magnetic field in the region of said sensor means, whereby the sensitivity of said sensor means to said alternating magnetic field is enhanced.

2. A system according to claim 1 wherein said sensor means further includes a third sensor coil positioned to couple to said vertical component of said alternating magnetic field and coupled to said processing means to substantially determine only said vertical magnitude.

3. A system according to claim 1, wherein said first and second sensor coils are mounted at right-angles to one another.

4. A system according to claims 1, 2, or 3 wherein said cancelling means comprise compensating coils mounted in the region of said sensor means and arranged in a Helmholtz configuration to substantially cancel the earth's magnetic field in the region of said sensor means.

5. A system according to claims 1, 2 or 3 wherein said cancelling means include a three-axis magnetometer operable to energize three sets of compensating coils, associated with the respective magnetometer axes, through a current servo to null the earth's magnetic field detected by the magnetometer.

6. A system according to claims 1, 2 or 3, wherein said cancelling means includes a flux valve operable to energize three sets of compensating coils, associated with respective axes of the flux valve, through a current servo to null the earth's magnetic field detected by the flux valve.

7. An airborne system according to claim 6 further including first means coupledd to said current servo for deriving a compensatory signal for latitude and altitude compensation of an aircraft, said compensation for avoidance of said source of alternating magnetic field.

8. An airborne system according to claim 7, further including second means coupled to said current servo for deriving a compensatory signal for compensating for variations in the earth's magnetic field from place to place.

9. A system according to claims 1, 2, or 3, wherein said cancelling means is a source of d.c. current coupled to said sensor means such that the d.c. current therefrom operates to cancel the earth's magnetic field in the region of said sensor means.

10. A system according to claims 1, 2, or 3, wherein the cancelling means comprise a Hall Effect generator operable to derive a signal to cancel the earth's magnetic field.

* * * * *